United States Patent [19]
Iijima et al.

[11] Patent Number: 5,729,435
[45] Date of Patent: Mar. 17, 1998

[54] SEMICONDUCTOR DEVICE AND ASSEMBLY BOARD HAVING THROUGH-HOLES FILLED WITH FILLING CORE

[75] Inventors: Makoto Iijima; Tetsushi Wakabayashi; Toshio Hamano; Masaharu Minamizawa; Masashi Takenaka, all of Kawasaki; Taturou Yamashita, Satsuma-gun; Masataka Mizukoshi, Kawasaki, all of Japan

[73] Assignee: Fujitsu Limited, Kawasaki, Japan

[21] Appl. No.: 782,381

[22] Filed: Jan. 13, 1997

Related U.S. Application Data

[63] Continuation of Ser. No. 423,632, Apr. 17, 1995, abandoned.

[30] Foreign Application Priority Data

| Apr. 28, 1994 | [JP] | Japan | 6-092155 |
| Mar. 17, 1995 | [JP] | Japan | 7-059562 |

[51] Int. Cl.$^6$ ........................................ H05K 7/20
[52] U.S. Cl. ................... 361/704; 174/250; 174/252; 257/707; 257/713; 361/715; 361/717
[58] Field of Search ............... 29/830, 840; 174/252, 174/255, 260–261, 264–265; 257/786, 707, 713; 361/704, 705, 714–722, 728, 730, 733, 744, 746, 748, 760, 777, 784, 790, 794, 803

[56] References Cited

U.S. PATENT DOCUMENTS

| 4,050,756 | 9/1977 | Moore | 174/264 |
| 4,218,701 | 8/1980 | Shirasaki et al. | 357/72 |
| 4,322,778 | 3/1982 | Barbour et al. | 361/794 |
| 4,483,067 | 11/1984 | Parmentier | 29/890 |
| 4,783,722 | 11/1988 | Osaki et al. | 361/784 |
| 4,922,376 | 5/1990 | Pommer et al. | 361/386 |
| 4,954,313 | 9/1990 | Lynch . | |
| 5,280,413 | 1/1994 | Pai | 361/792 |
| 5,281,151 | 1/1994 | Arima et al. | 439/68 |
| 5,311,402 | 5/1994 | Kobayashi et al. | 361/784 |

FOREIGN PATENT DOCUMENTS

| 0-188-838 | 7/1986 | European Pat. Off. . |
| 0-382-203-A3 | 8/1990 | European Pat. Off. . |
| 0-525-651-A1 | 2/1993 | European Pat. Off. . |
| 0-569-705-A1 | 11/1993 | European Pat. Off. . |
| 0-598-914-A1 | 6/1994 | European Pat. Off. . |
| 2 586 885 | 10/1986 | Germany . |
| 0-207-853 | 1/1987 | Germany . |
| WO/91/10025 | 7/1991 | WIPO . |

OTHER PUBLICATIONS

IBM Technical Disclosure Bulletin, vol. 27, No. 7B, Dec. 1984, New York, p. 4226, XP002010996 "silicon integrated hight performance package".

*Abstract*. vol. 008, No. 213 (E–269), 28 Sep. 1984. and JP–A–59 099752 (Toshiba KK), 8 Jun. 1984.

IBM Technical Disclosure Bulletin, vol. 36, No. 5, 1 May 1993, pp. 181–182, XP99940895 "Alternate Polymide/Metal Thin Film Packaging Structure".

*Abstract*. vol. 009, No. 295 (E–360), 21 Nov. 1985. and JP–A–60 134446 (Hitachi Seisakusho KK), 17 Jul. 1985.

WO–A–93 26142 (Mitsui Toatsu Chemicals) 23 Dec. 1993. *Abstract*.

(List continued on next page.)

*Primary Examiner*—Gregory D. Thompson
*Attorney, Agent, or Firm*—Armstrong, Westerman, Hattori, McLeland & Naughton

[57] ABSTRACT

A semiconductor device includes a board base having through-holes filled with a filling core, and an additive layer provided on an upper surface of the board base as well as an upper surface of the filling core wherein the additive layer includes a wiring pattern having one or more paths. The semiconductor device further includes a semiconductor chip fixed on an upper surface of the additive layer, and nodes provided on a lower surface of the board base, wherein the one or more paths are laid out without a passage restriction posed by the through-holes, and are used for electrically connecting the semiconductor chip and the nodes.

6 Claims, 19 Drawing Sheets

OTHER PUBLICATIONS

IEEE Transactions on Components, Hybrids, and Manufacturing Technology, "A Multilevel Epoxy Substrate for Flip–Chip Hybrid Multichip Module Applications" Vo. 15, No. 1, Feb. 1, 1992.

Patent Abstract of Japan, Publication No. JP4276631, vol. 17, No. 75 (E–1320), Feb.15, 1993.

IBM Technical Disclosure Bulletin, vol. 32, N. 8A, Jan. 1, 1990, pp. 178/179 LSI Packaging Design.

SEMICONDUCTOR DEVICE AND ASSEMBLY BOARD HAVING THROUGH-HOLES FILLED WITH FILLING CORE

This application is a continuation of application Ser. No. 08/423,632, filed Apr. 17, 1995, now abandoned.

BACKGROUND OF THE INVENTION

1. Field of the Invention

The present invention generally relates to semiconductor devices, and more particularly relates to a semiconductor device of the ball grid array (hereinafter referred to as BGA) type and a method of forming the same.

In recent years, there has been a significant increase in circuit density of semiconductor devices, and, also, there has been an increasing demand for a higher density in implementing semiconductor devices. This leads to more attention being paid on semiconductor devices of the BGA type, which can make intervals of nodes wider than can those of the QFP type, and, also, can be implemented more closely to each other.

There has been also an increase in frequencies of signals processed by the semiconductor devices. Thus, semiconductor devices of the BGA type desirably have configurations which are suitable for the processing of high frequency signals.

Also, the amount of heat generated by semiconductor chips has a tendency to increase as the semiconductor chips are made in higher circuit densities. Thus, semiconductor devices of the BGA type are required to have structures which are suitable for releasing heat.

2. Description of the Related Art

FIG. 1 shows a semiconductor device of the BGA type disclosed in the U.S. Pat. No. 5,166,772.

A semiconductor device 10 includes an assembly board 11, a semiconductor chip 12 fixed to a central portion of an upper surface of the assembly board 11, solder balls 13 arranged at nodes of a grid pattern on a lower surface of the assembly board 11, and a cover 14 made of a resin for sealing the semiconductor chip 12.

In FIG. 1, wires 17 couple between pads 15 on the semiconductor chip 12 and pads 16 on the assembly board 11.

FIG. 2 shows an enlarged plan view of the assembly board 11 of FIG. 1. FIG. 3 shows a cross-sectional view of the assembly board 11 taken along a line shown as A—A in FIG. 2. As shown in FIG. 3, the assembly board 11 includes a printed board 20 and an additive layer 21 provided on the printed board 20. The assembly board 11 also includes through-holes $22_1$ to $22_5$.

Each of the pads 15 on the semiconductor chip 12 is electrically connected to a corresponding one of the solder balls 13 provided beneath the assembly board 11. For example, as can be seen in FIG. 1, FIG. 2, and FIG. 3, a pad $15_1$ is connected to a solder ball $13_1$ via a wire $17_1$, a pad $16_1$, a wiring pattern 23 on the additive layer 21, and a through-hole inner layer 24 provided on an inner surface of the through-hole $22_2$.

In this configuration, the through-holes $22_1$ to $22_5$ are open holes, so that the additive layer 21 cannot be formed at the locations of the through-holes $22_1$ to $22_5$. Thus, wiring patterns on the additive layer 21 cannot be formed in such manner that they traverse the locations of the through-holes $22_1$ to $22_5$.

This leads to a restriction on formation of wiring patterns such that paths of the wiring patterns cannot be laid freely.

Take an example of forming a wiring pattern connecting the pad $15_1$ and the through-hole $22_2$. A straight wiring pattern 25 as shown by dotted lines in FIG. 2 cannot be formed. Thus, the wiring pattern 23 ends up having a bending shape detouring from a straight line in order to avoid the through-holes $22_1$ and $22_5$.

As a result, the wiring pattern 23 is bound to have a longer path length than otherwise. This is undesirable in terms of signal propagation, since signals having high frequencies may be distorted in the longer path.

Since the semiconductor chip 12 is sealed by the cover 14, it is difficult for heat generated by the semiconductor chip 12 to be transferred to the outside. Namely, the semiconductor device 10 is not suitably structured in terms of releasing heat.

Accordingly, there is a need in the field of semiconductor devices for a semiconductor device in which there is no restriction on formation of wiring paths and heat can be released with ease, and for a method of forming that semiconductor device.

Also, there is a need for a semiconductor device in which there is a wider scope for an arrangement of wirings for external connection.

SUMMARY OF THE INVENTION

Accordingly, it is a general object of the present invention to provide a semiconductor device and method of forming the same which satisfies the need described above.

It is another and more specific object of the present invention to provide a semiconductor device in which there is no restriction on formation of wiring paths and heat can be released with ease.

In order to achieve the above objects, a semiconductor device according to the present invention includes a board base having through-holes filled with a filling core, an additive layer provided on an upper surface of the board base as well as an upper surface of the filling core, wherein the additive layer includes a wiring pattern having one or more paths, a semiconductor chip fixed on an upper surface of the additive layer, and nodes provided on a lower surface of the board base, wherein one or more paths are laid out without a restriction posed by the through-holes, and are used for electrically connecting the semiconductor chip and the nodes.

Thus, according to the present invention, the through-holes are filled with the filling core, so that a single flat surface can be obtained, which is flush with the upper surface of the board base. This leads to the additive layer being formed on portions of the through-holes. With the additive layer covering the entire surface, there is no need to get around the through-holes when laying a wiring pattern.

Also, in the semiconductor device described above, the semiconductor chip can be fixed with its face down on the upper surface of the additive layer by a bonding process. Then, the semiconductor device can include a dam member having a frame shape and adhered to the upper surface of the board so as to surround the semiconductor chip, and a metal plate adhered to a back surface of the semiconductor chip and to the dam member.

Thus, according to the present invention, the metal plate adhered to the back surface of the semiconductor chip can release the heat generated by the semiconductor chip.

It is yet another object of the present invention to provide a method of forming a semiconductor device in which there is no restriction on formation of wiring paths.

In order to achieve the above object, a method of forming a semiconductor device according to the present invention includes the steps of forming through-holes through a board base, forming through-hole inner layers inside the through-holes by plating metal and by etching the metal to leave the through-hole inner layers, filling the through-holes with a synthetic resin, forming an insulator layer on the board base and on the synthetic resin filling the through-holes, forming a wiring pattern on the insulator layer by plating conductive metal and by etching the conductive metal to leave the wiring pattern, fixing a semiconductor chip over the board base, and forming nodes beneath a lower surface of the board base.

Thus, in the semiconductor device formed by the method described above, the through-holes are filled with the synthetic resin, so that there is no need to get around the through-holes when laying the wiring pattern.

It is still another object of the present invention to provide a semiconductor device in which there is a wider scope for an arrangement of wirings for external connection.

In order to achieve the above object, a semiconductor device according to the present invention includes a semiconductor chip having first electrodes on one surface thereof and at least one second electrode on another surface thereof, a board having first wirings and second wirings for external connection, wherein the first wirings are connected to the first electrodes so that the semiconductor chip is mounted on the board, and a conductive member covering the semiconductor chip so as to electrically connect at least one second electrode with the second wirings.

Thus, in the semiconductor device described above, at least one second electrode can be electrically connected with the second wirings via the conductive member. Since the conductive member completely covers the semiconductor chip, the second wirings can be anywhere around the semiconductor chip to be electrically connected to the conductive member. Thus, there is a wider scope for the arrangement of the second wirings for the external connection.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 4:
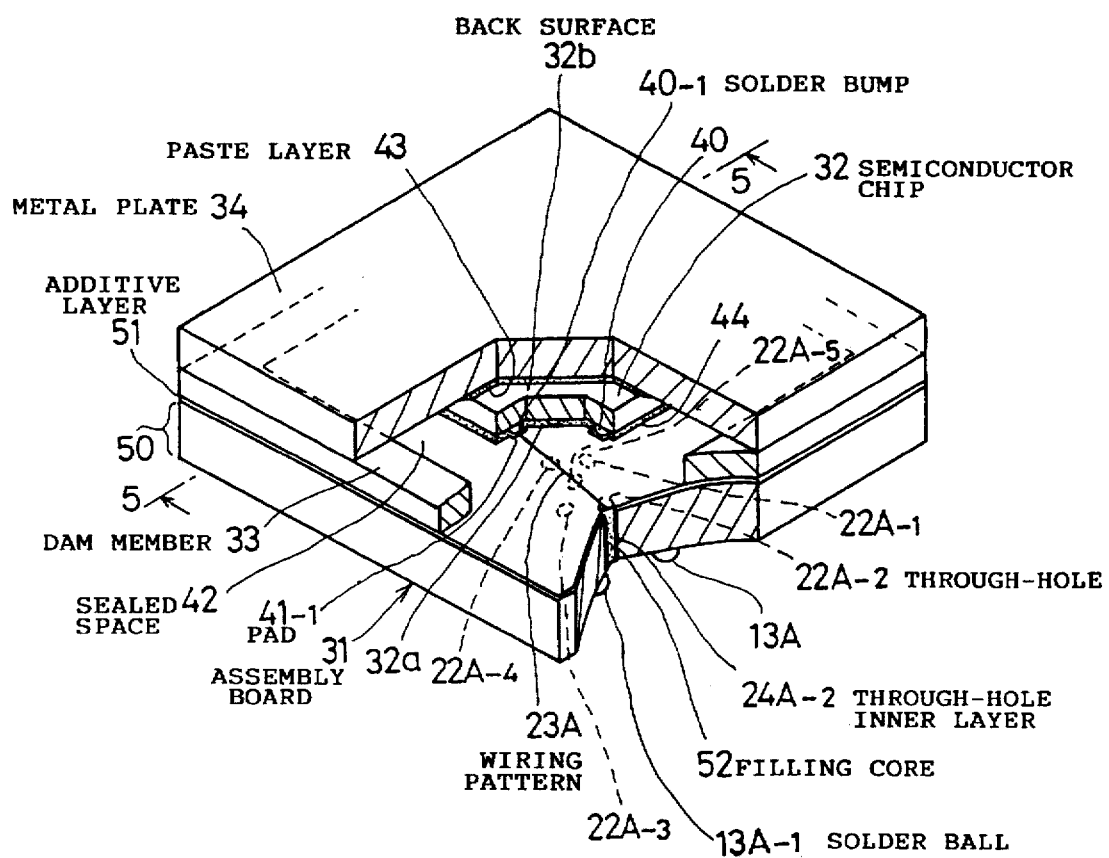
FIG. 4 is a partially sectional isometric view of a first embodiment of a BGA type semiconductor device according to the present invention.
Figure 5:
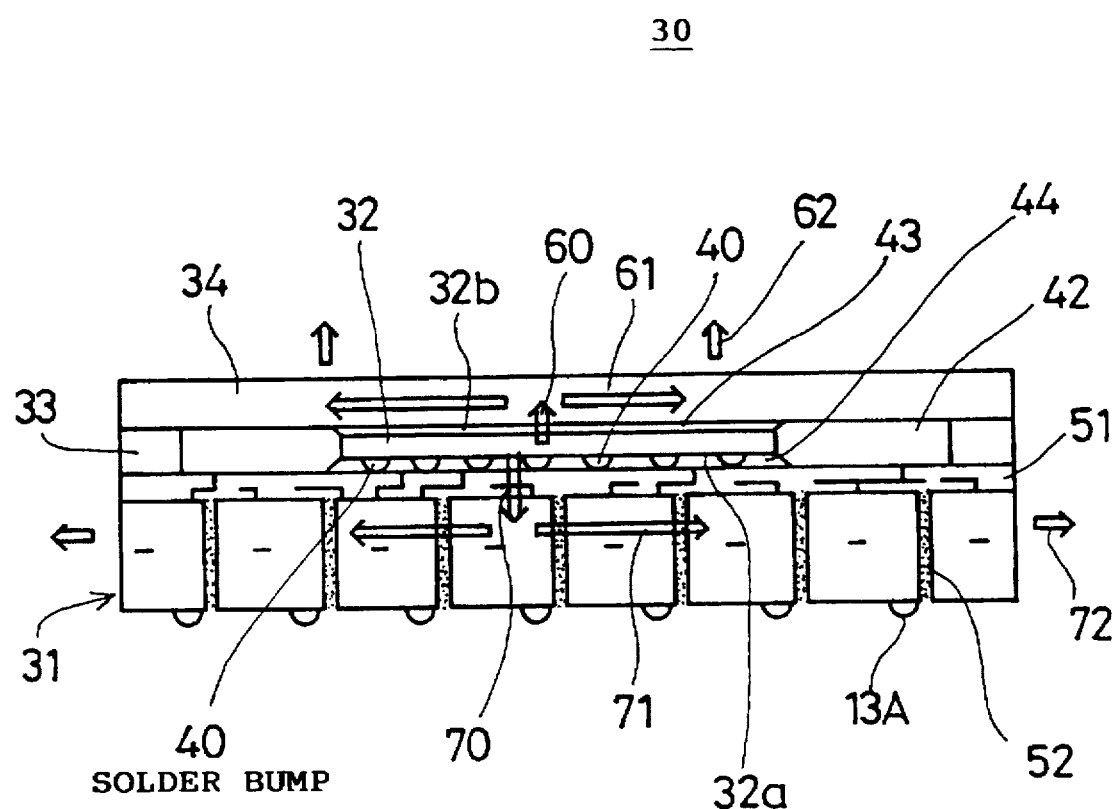
FIG. 5 is a cross-sectional view of the BGA type semiconductor device taken along a line 5—5 in FIG. 4.

FIG. 4 and FIG. 5 show a partially exposed isometric view and a cross-sectional view, respectively, of a first embodiment of a BGA type semiconductor device 30 according to the present invention.

The BGA type semiconductor device 30 includes an assembly board 31, a semiconductor chip 32, a dam member 33, a metal plate 34, and solder balls 13A.

The semiconductor chip 32 has solder bumps 40 on a surface 32a thereof. The semiconductor chip 32 is fixed with its face down to a central portion of the assembly board 31 by a flip-chip method soldering the solder bumps 40 with pads $41_{-1}$ on the assembly board 31.

The dam member 33 is formed from the same material as that of the assembly board 31, and has a shape of a rectangular frame. The dam member 33 is adhered to a perimeter area of the assembly board 31.

The metal plate 34 is adhered to the dam member 33 at a peripheral area of a lower surface thereof so as to cover the semiconductor chip 32. Thus, a space 42 of the semiconductor device 30 containing the semiconductor chip 32 is sealed.

A paste layer 43 is provided between a back (upper) surface $32b$ of the semiconductor chip 32 and the metal plate. The paste layer 43 is formed from an insulating paste having a high heat transfer characteristic which is supplemented by fillers such as AlN, diamond, and the like.

Another paste layer 44 is provided between the semiconductor chip 32 and the assembly board 31. The paste layer 44 is formed from an insulating paste having a high heat transfer characteristic.

Each of the solder bumps 40 of the semiconductor chip 32 is electrically connected with a corresponding one of the solder balls 13A.

Figure 6:
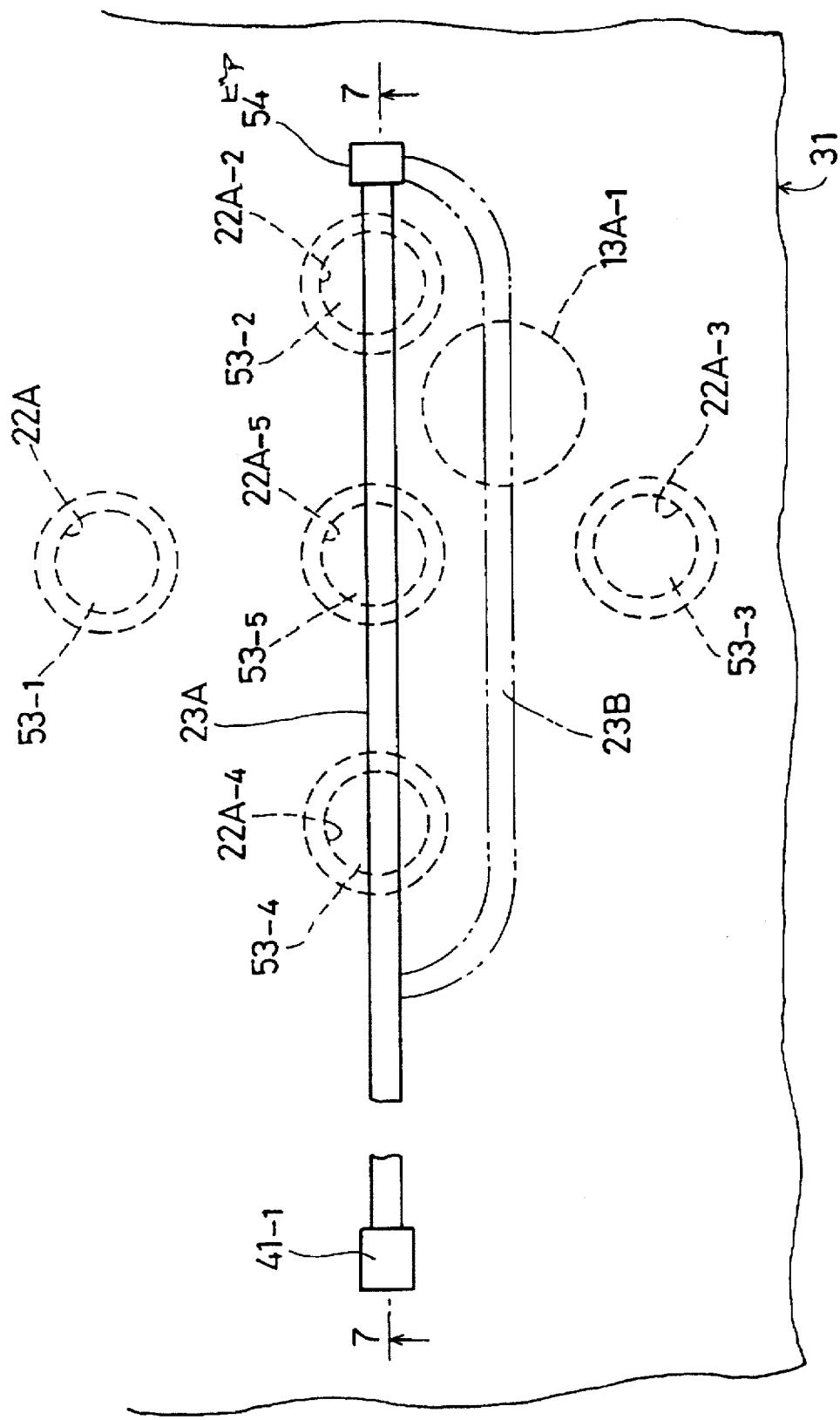
FIG. 6 is an enlarged partial plan view of an assembly board of FIG. 4.
Figure 7:
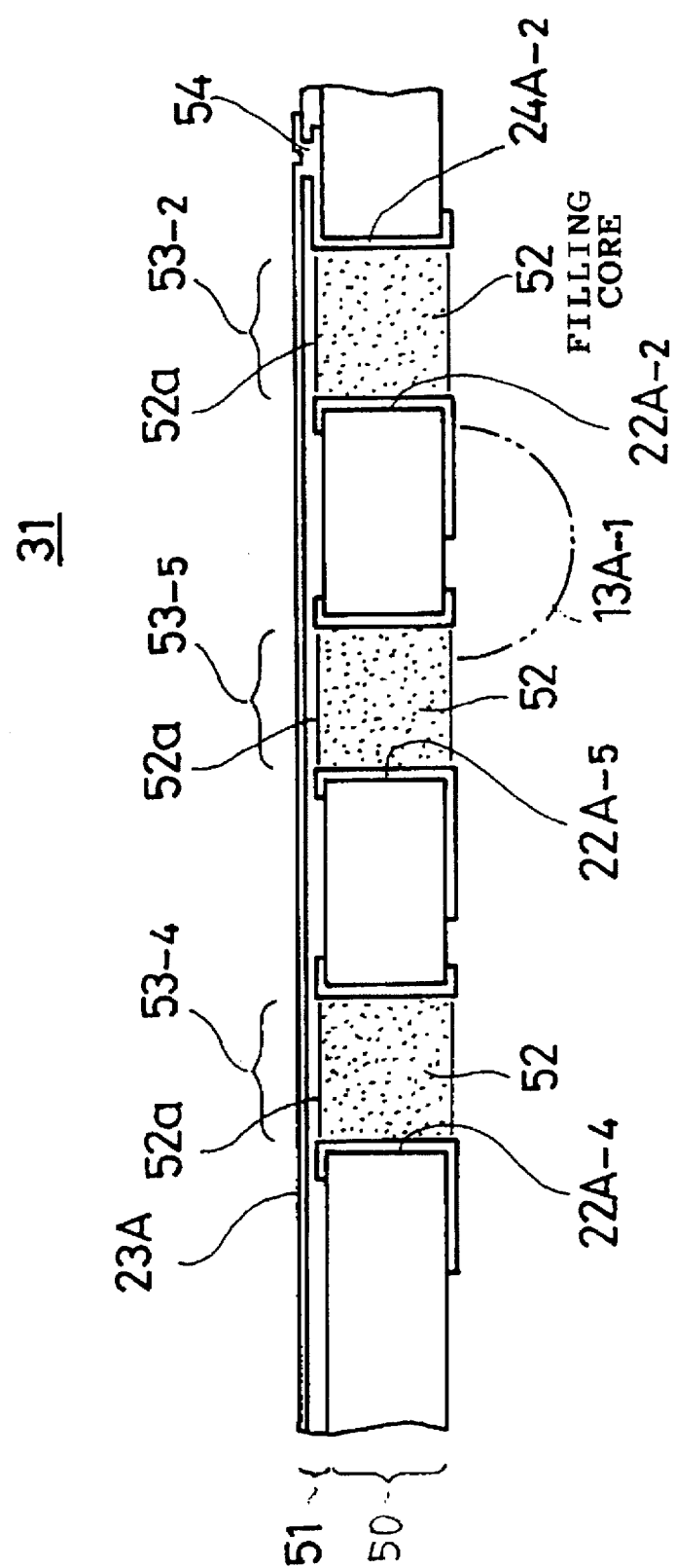
FIG. 7 is a cross-sectional view of the assembly board taken along a line 7—7 in FIG. 6.
Figure 8:
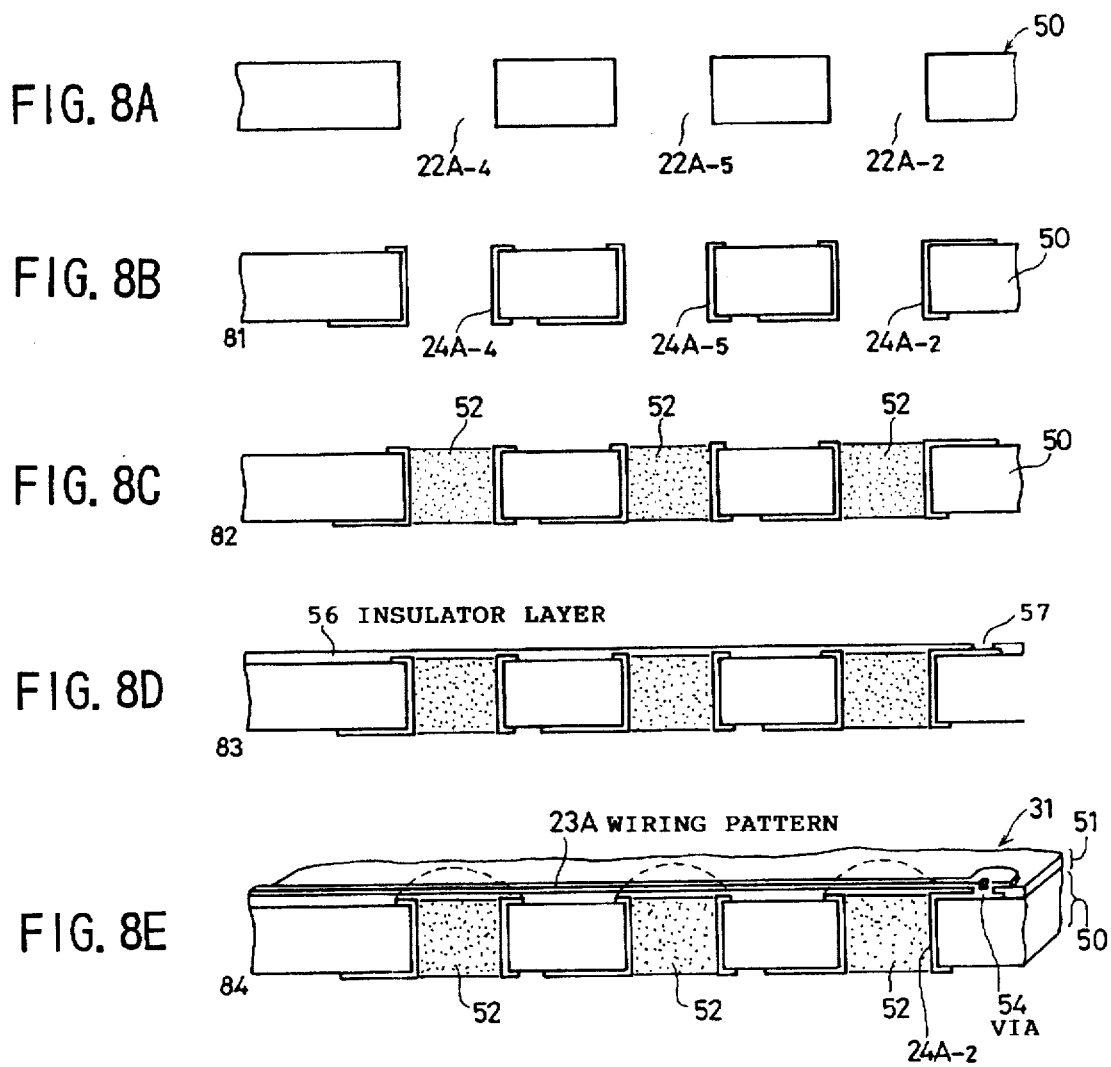
FIGS. 8A to 8E are process charts explaining a process of forming the assembly board of FIG. 4.

FIG. 6 and FIG. 7 are an enlarged plan view and a cross-sectional view, respectively, of the assembly board 31.

As shown in FIG. 7, the assembly board 31 includes a printed board 50 as a board base and an additive layer 51 provided on the printed board 50. The additive layer 51 includes a wiring pattern 23A. Through-holes $22A_{-1}$ to $22A_{-5}$ are formed only through the printed board 50, and have through-hole inner layer $24-A_{-2}$ to $24-A_{-5}$ made of Cu. Also, each of the through-holes $22A_{-1}$ to $22A_{-5}$ is filled with a filling core 52 formed from a synthetic resin.

Thus, the additive layer 51 is formed on the printed board 50 at an area other than the through-holes $22A_{-1}$ to $22A_{-5}$, and is formed on an upper surface $52a$ of the filling core 52 at the through-holes $22A_{-1}$ to $22A_{-5}$. Portions of the additive layer 51 which are directly above the through-holes $22A_{-1}$ to $22A_{-5}$ are shown as through-hole portions $53_1$ to $53_5$.

Since the additive layer 51 does not have an opening, paths of wiring patterns can be laid on any place of the additive layer 51. In other words, there is a wider scope for the formation of wiring patterns without a restriction posed by through-holes $22A_1$ to $22A_5$, as compared to the related art.

As shown in FIG. 6, a wiring pattern 23A is formed to traverse the through-hole portions $53_4$, $53_5$, and $53_2$. One end of the wiring pattern 23A is coupled to the through-hole inner layer $24A_{-2}$ via a via 54.

In the related art, a wiring pattern 23B would have to get around the through-holes as shown by dotted lines in FIG. 6. In contrast, the wiring pattern 23A in the case of the present invention is straight, and, thus, has a path of the shortest length.

In FIG. 4, the solder bump $40_1$ of the semiconductor chip 32 is electrically connected to the solder ball $13A_1$ beneath the assembly board 31 via the pad $41_{-1}$, the wiring pattern 23A, the via 54, and the through-hole inner layer $24A_{-2}$. The semiconductor device 30 is implemented on a printed board (not shown) via the solder bumps 13A.

Characteristics of the semiconductor device 30 in operation will be described below.

[Characteristics for High Frequency Signals]

The wiring pattern 23A is laid on the shortest path, and there is no wire used in the flip-chip method. Thus, signals having a high frequency can be conducted well without a distortion. Thus, the semiconductor device 30 has a desirable characteristic regarding high frequency signals.

[Characteristics for Heat Release]

With reference to FIG. 5, heat generated by the semiconductor chip 32 is conducted to the metal plate 34 via the paste layer 43, which path is shown by an arrow 60. Then, this heat is extended within the metal plate 34 as shown by arrows 61, and is released into the air as shown by arrows 62.

Also, heat generated by the semiconductor chip 32 is transferred to the assembly board 31 via the paste layer 44, which path is shown by an arrow 70. Then, this heat is released into air as shown by arrows 72 after extending within the assembly board 31 as shown by arrows 71.

Figure 1:
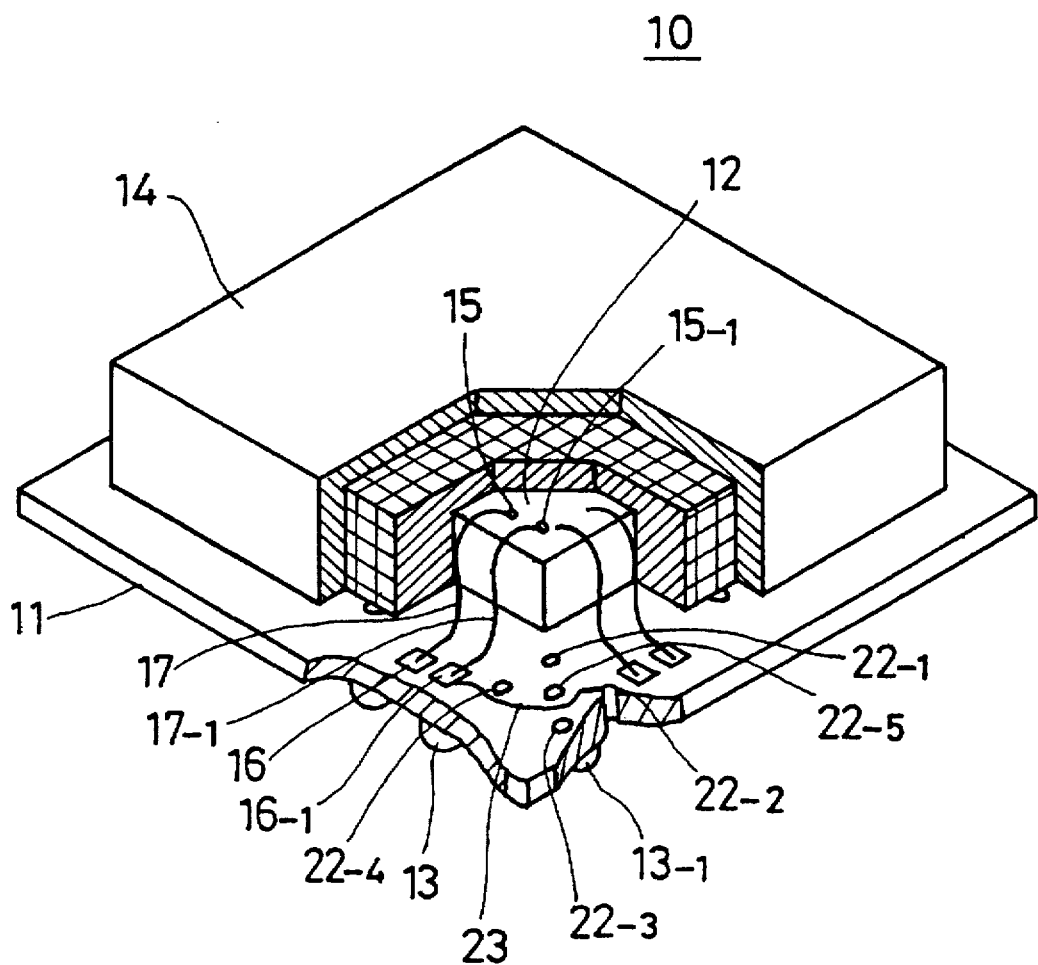
FIG. 1 is a partially sectional isometric view of a BGA type semiconductor device of the related art.
Figure 2:
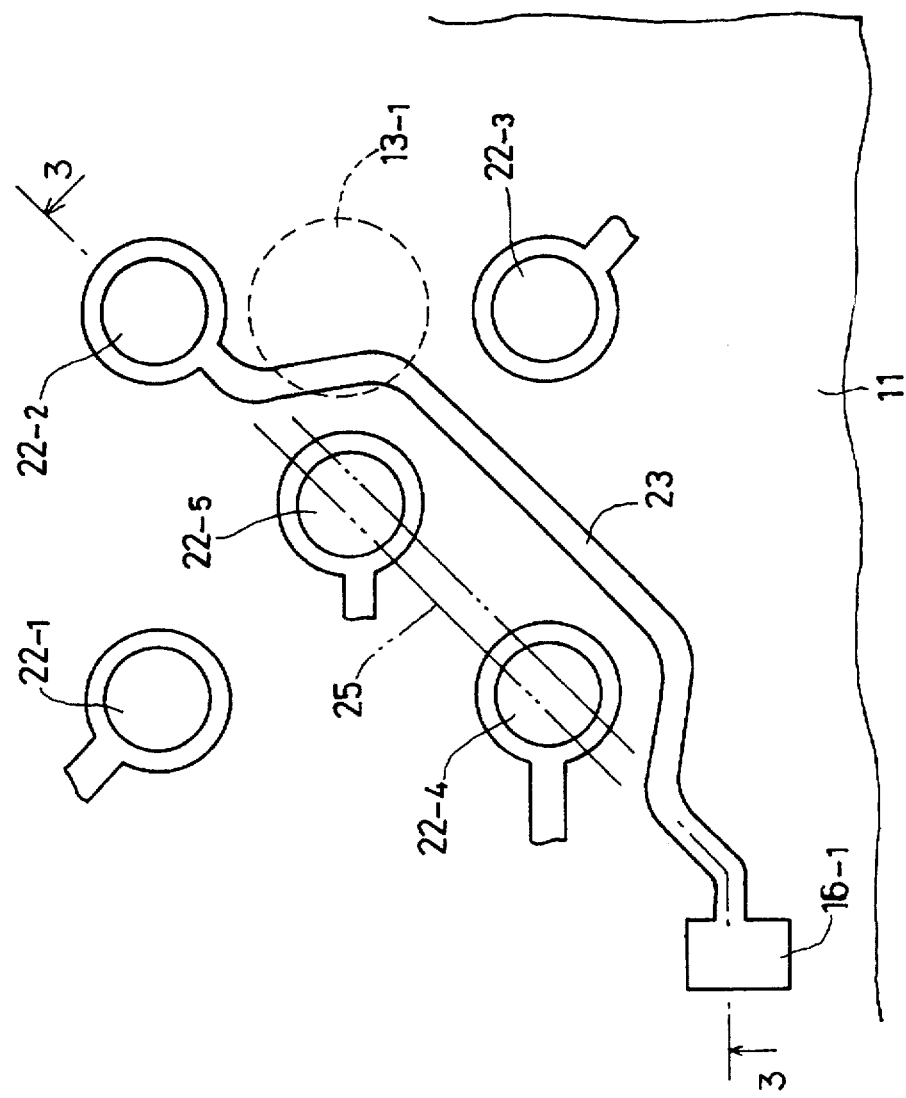
FIG. 2 is an enlarged partial plan view of an assembly board of FIG. 1.
Figure 3:
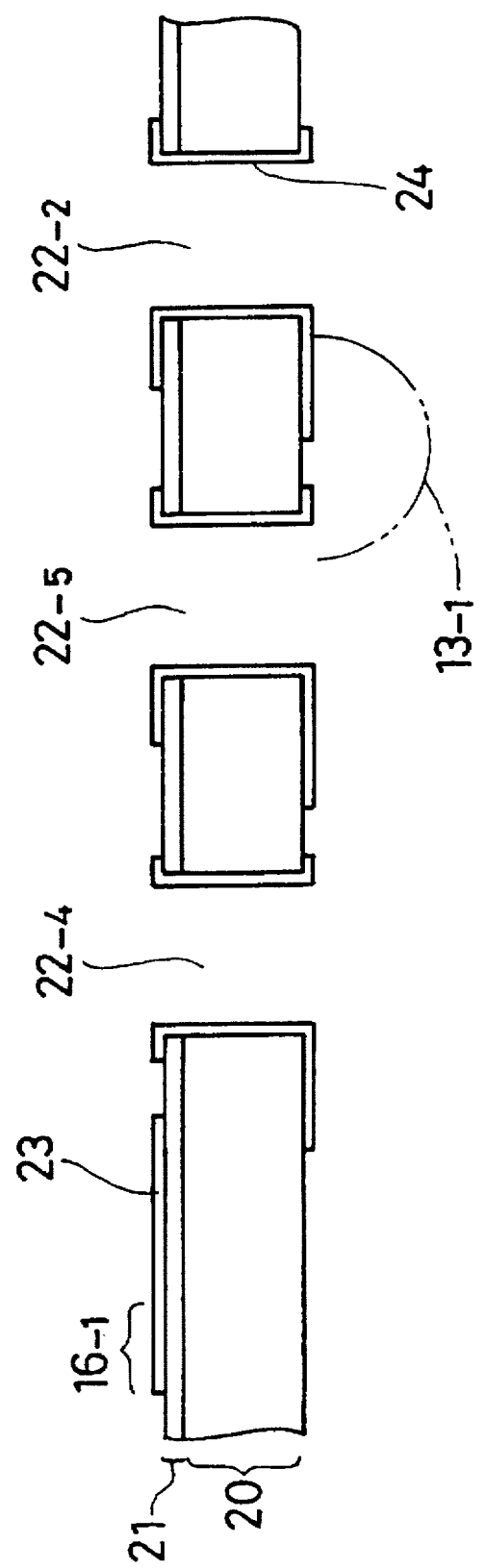
FIG. 3 is a cross-sectional view of the assembly board taken along a line 3—3 in FIG. 2.

Accordingly, heat resistance within the semiconductor device 30 is smaller than that of the semiconductor device 10 of FIG. 1, so that heat produced by the semiconductor chip 32 can be released more effectively than in the related art.

A method of forming the assembly board 31 will be described below with reference to FIGS. 8A to 8E.

As shown in FIG. 8A, a through-hole forming process is carried out to create the through-hole. Then, a through-hole inner layer forming process 81 is carried out, as shown in FIG. 8B, to form the through-hole inner layer $24A_{-2}$, $24A_{-4}$ and $24A_{-5}$ by plating Cu and etching the Cu plate.

Then, a through-hole filling process 82 is carried out to fill a synthetic resin in the through-holes $22A_{-2}$, $22A_{-4}$, and $22A_{-5}$, as shown in FIG. 8C. All the through-holes $22A_{-2}$, $22A_{-4}$, and $22A_{-5}$ are filled to create the filling core 52.

Then, an insulator layer forming process 83 is performed in order to form the additive layer 51. As shown in FIG. 8D, an insulator layer 56 is formed completely over the printed board 50 including portions of the through-holes. Also, the via-hole 57 is formed through the insulator layer 56 at a predetermined location.

Then, a wiring pattern forming process 84 is performed. This is done by plating Cu and etching the Cu plate so as to form the via 54 and the wiring pattern 23A as shown in FIG. 8E. Finally, gold (Au) is plated on the surface.

In the following, other embodiments of the present invention will be described with reference to FIG. 9 and the following drawings. In the figures, the same elements as those of FIG. 4 through FIGS. 8A to 8E are referred to by the same numerals, and will not be given a further description.

Figure 9:
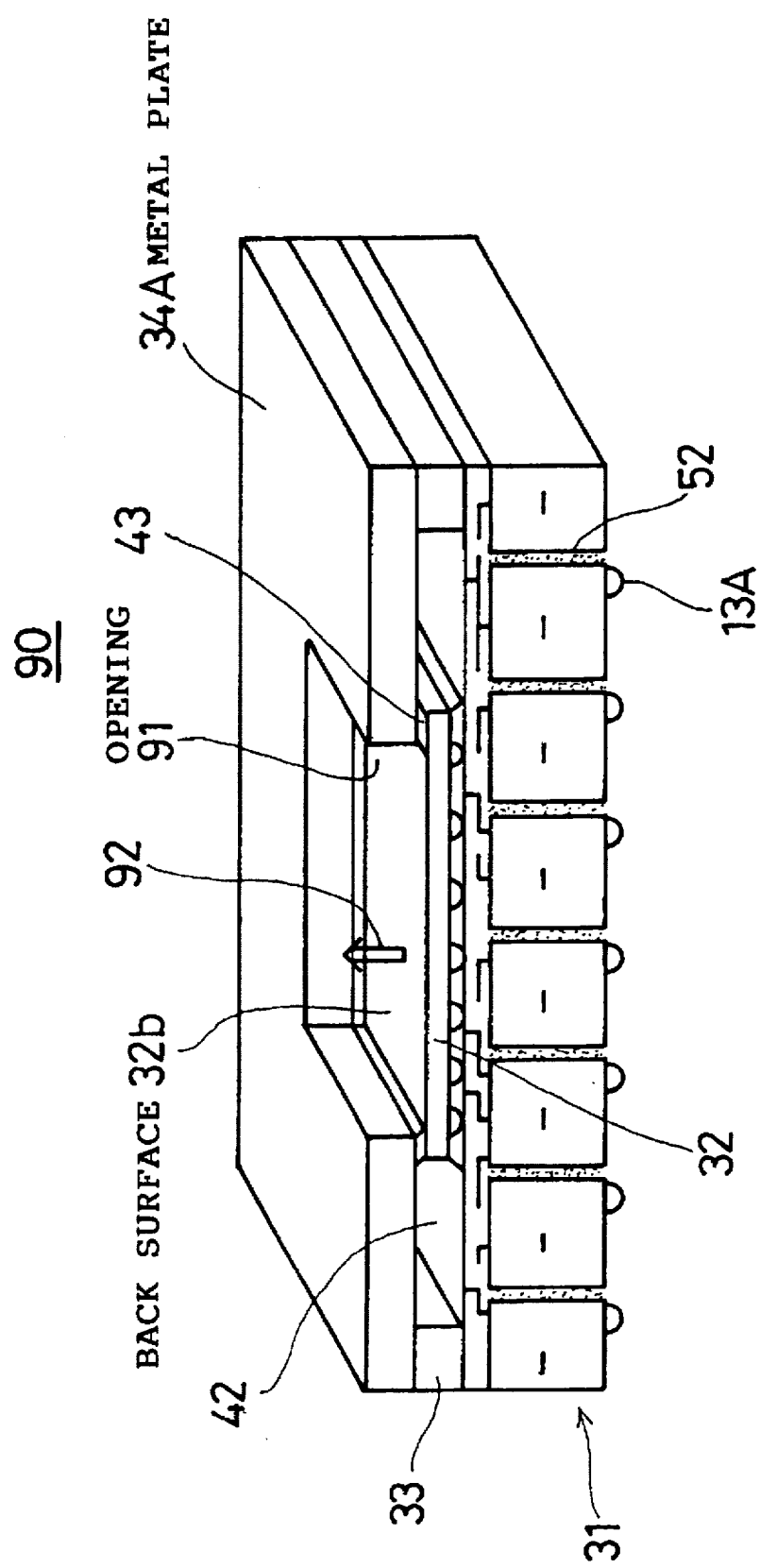
FIG. 9 is a partially sectional isometric view of a second embodiment of a BGA type semiconductor device according to the present invention.

FIG. 9 shows a second embodiment of a BGA type semiconductor device 90 according to the present invention.

A metal plate 34A has a rectangular opening 91 at the center thereof. The rectangular opening 91 is smaller than the semiconductor chip 32. A portion of the lower surface of the metal plate 34A around the opening 91 is adhered to the semiconductor chip 32 at an edge proximity thereof. Thus, a space 42 is sealed.

A back surface $32b$ of the semiconductor chip 32 is exposed to air, so that heat generated by the semiconductor chip 32 can be released into air as shown by an arrow 92. Thus, an inside heat resistance of the semiconductor device 90 is smaller than that of the semiconductor device 30 of FIG. 4.

Figure 10:
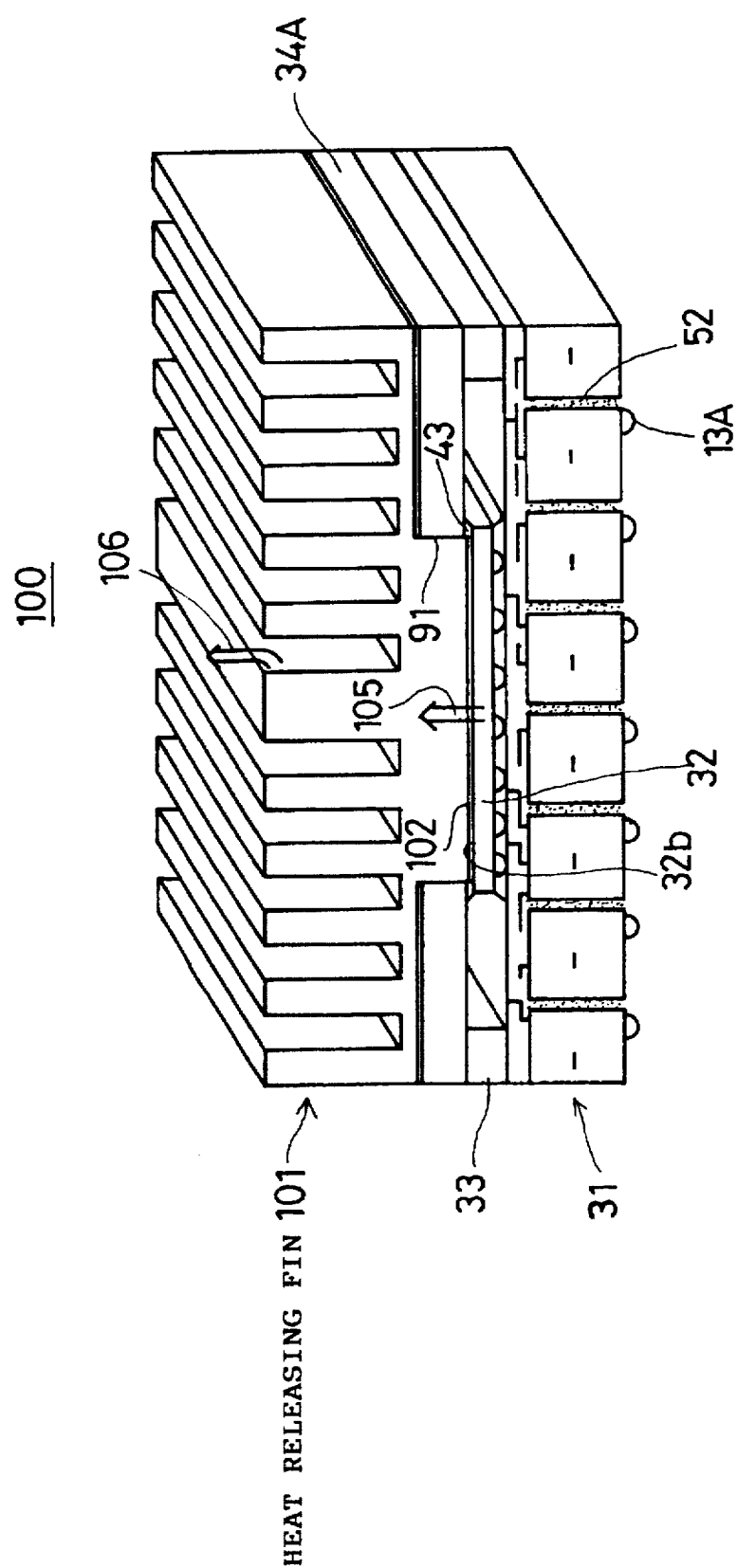
FIG. 10 is a partially sectional isometric view of a third embodiment of a BGA type semiconductor device according to the present invention.

FIG. 10 shows a third embodiment of a BGA type semiconductor device 100 according to the present invention.

The semiconductor device 100 differs from the semiconductor device 90 of the second embodiment only in an additional heat releasing fin 101.

The heat releasing fin 101 has a portion fitted into the opening 91, and is adhered to the back surface $32b$ of the semiconductor chip 32 with a paste layer 102 having a high heat transfer rate.

Accordingly, heat generated by the semiconductor chip 32 is transferred to the heat releasing fin 101 as shown by an arrow 105, and, then, is released into air as shown by an arrow 106. Thus, an inside heat resistance of the semiconductor device 100 is smaller than that of the semiconductor device 30

Figure 11:
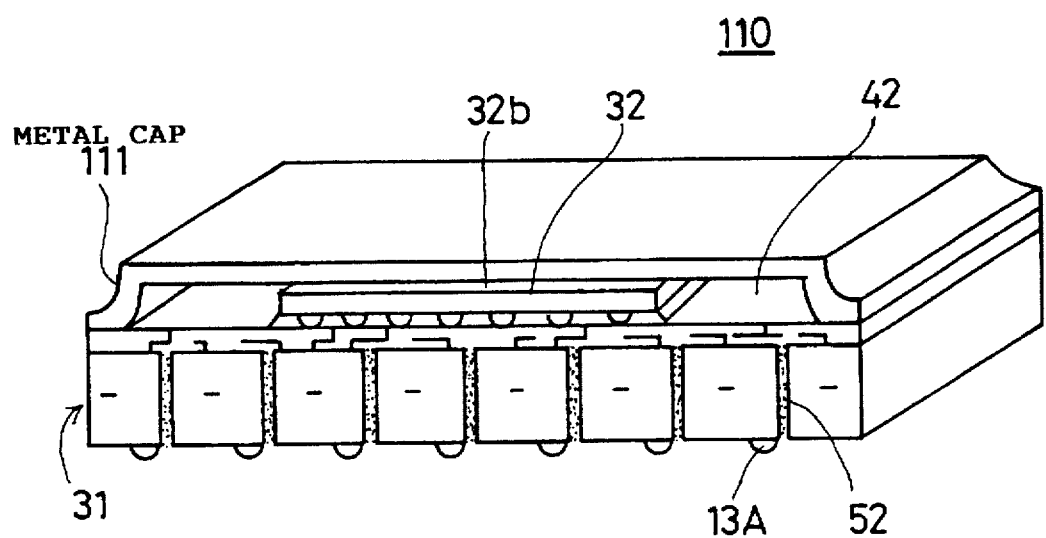
FIG. 11 is a partially sectional isometric view of a fourth embodiment of a BGA type semiconductor device according to the present invention.

FIG. 11 shows a fourth embodiment of a BGA type semiconductor device 110 according to the present invention.

The semiconductor device 110 uses a metal cap 111 instead of the dam member 33 and the metal plate 34 of FIG. 4. The metal cap 111 is adhered to the back surface 32b of the semiconductor chip 32 and to the perimeter area of the upper surface of the assembly board 31.

The semiconductor device 110 can be constructed with a fewer number of components, compared to the semiconductor device 30 of FIG. 4. Yet, the semiconductor device 110 has an inside heat resistance as small as that of the semiconductor device 30.

Figure 12:
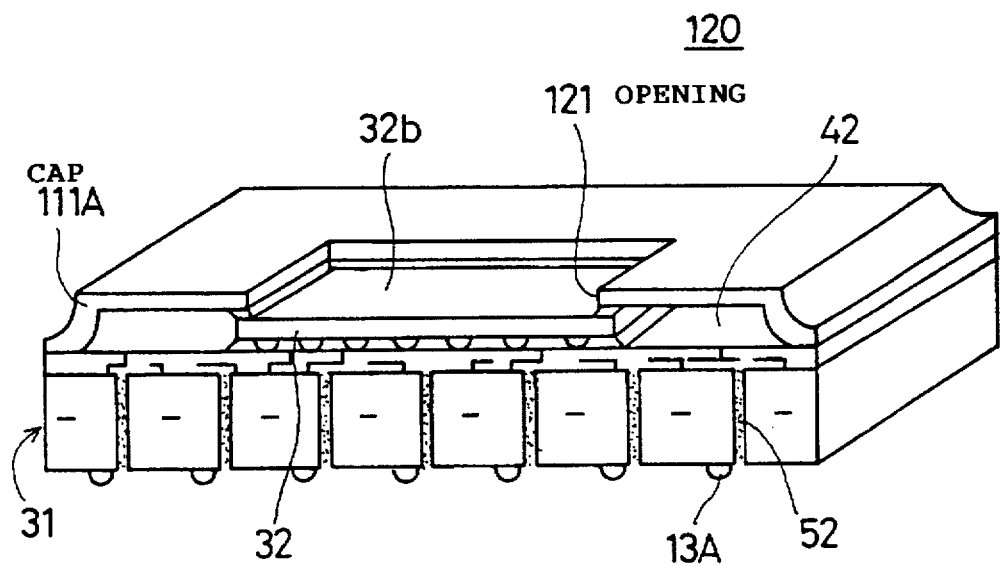
FIG. 12 is a partially sectional isometric view of a fifth embodiment of a BGA type semiconductor device according to the present invention.

FIG. 12 shows a fifth embodiment of a BGA type semiconductor device 120 according to the present invention.

In the semiconductor device 120, the cap 111A has a rectangular opening 121, which has a smaller size than the semiconductor chip 32. The back surface 32b of the semiconductor chip 32 is exposed to air in order to better release heat.

Figure 13:
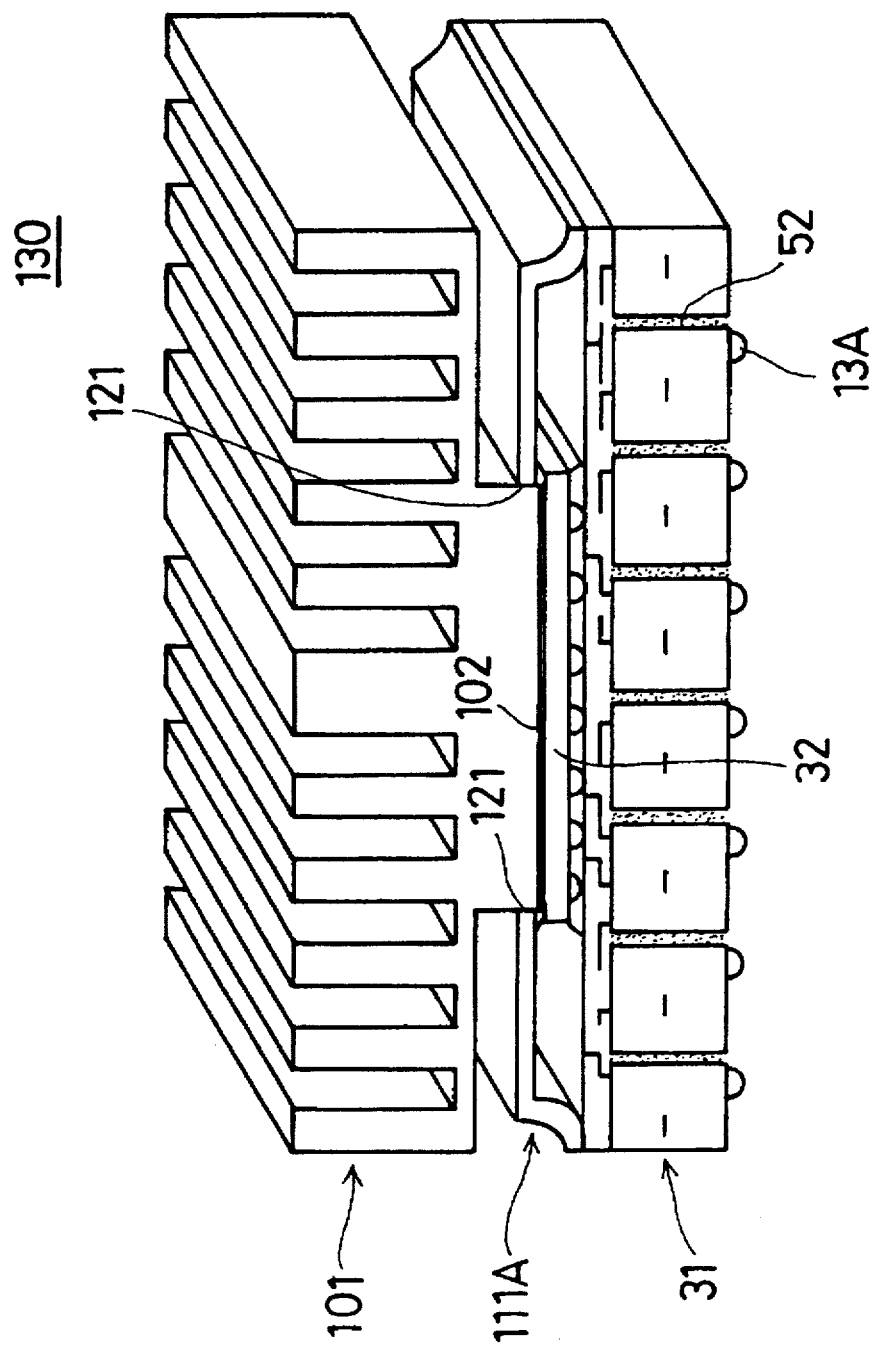
FIG. 13 is a partially sectional isometric view of a sixth embodiment of a BGA type semiconductor device according to the present invention.

FIG. 13 shows a sixth embodiment of a BGA type semiconductor device 130 according to the present invention.

The semiconductor device 130 has a heat releasing fin 101. The remainder of the device is the same as the semiconductor device 120 of the fifth embodiment. The heat releasing fin 101 is partly fitted into the opening 91 so as to be adhered to the back surface 32b of the semiconductor chip 32. The adhesion is provided by a paste layer 102 having a high heat transfer rate.

Figure 14:
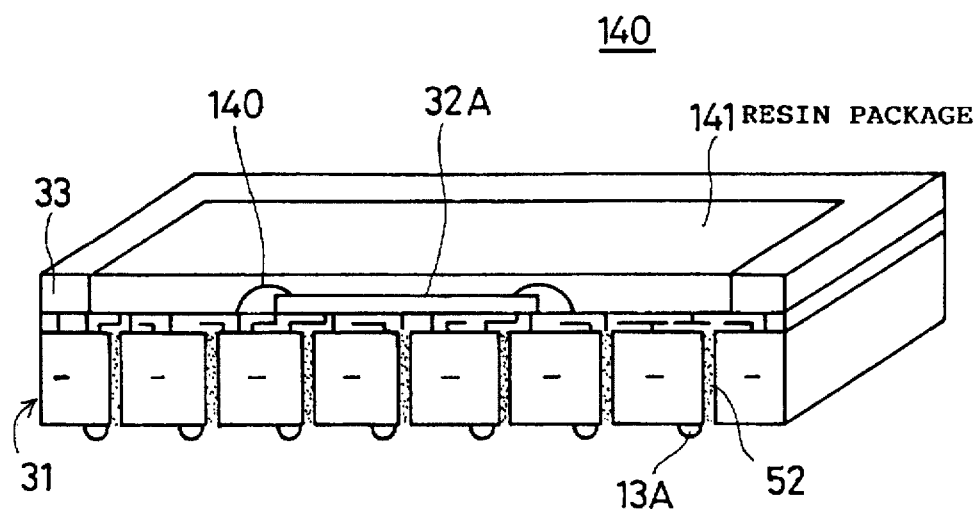
FIG. 14 is a partially sectional isometric view of a seventh embodiment of a BGA type semiconductor device according to the present invention.

FIG. 14 shows a seventh embodiment of a BGA type semiconductor device 140 according to the present invention.

In the semiconductor device 140, the semiconductor chip 32A is provided by a face-up bonding technique. There are wires 140 coupling the semiconductor chip 32A with the assembly board 31. A resin package 141 covers the semiconductor chip 32A and the wires 140 to seal those elements. The resin package 141 is formed by putting the resin inside the dam member 33.

Figure 15:
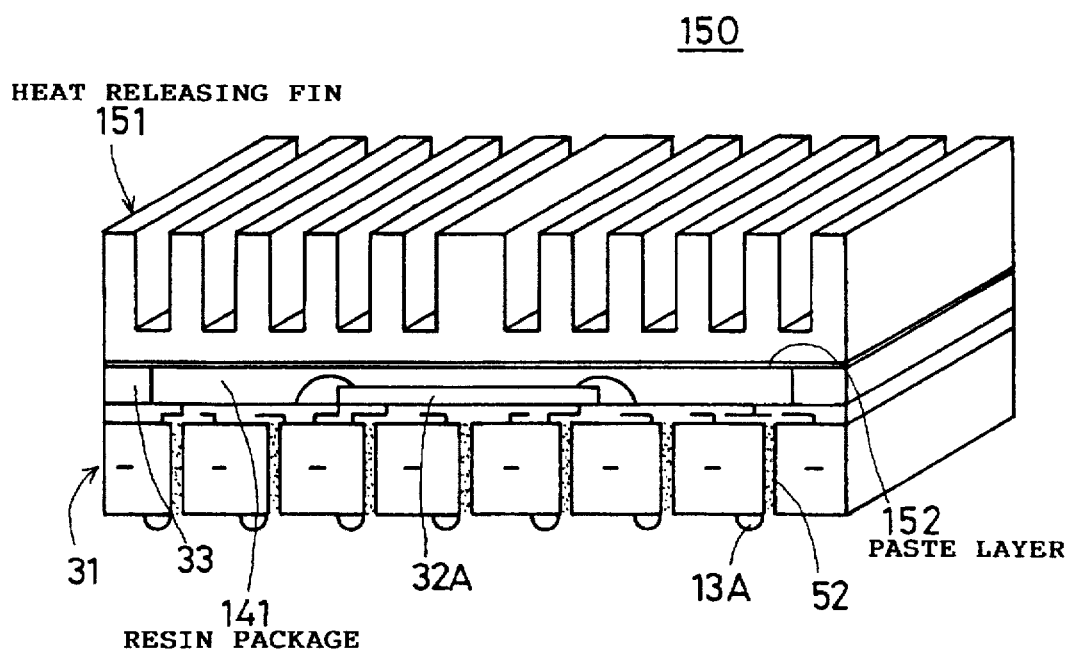
FIG. 15 is a partially sectional isometric view of an eighth embodiment of a BGA type semiconductor device according to the present invention.

FIG. 15 shows an eighth embodiment of a BGA type semiconductor device 150 according to the present invention.

The semiconductor device 150 has such a structure that a heat releasing fin 151 is provided on the semiconductor device 140 of the seventh embodiment. The heat releasing fin 151 is adhered to the upper surface of the resin package 141 by the paste layer 152 having a high heat transfer rate.

Figure 16:
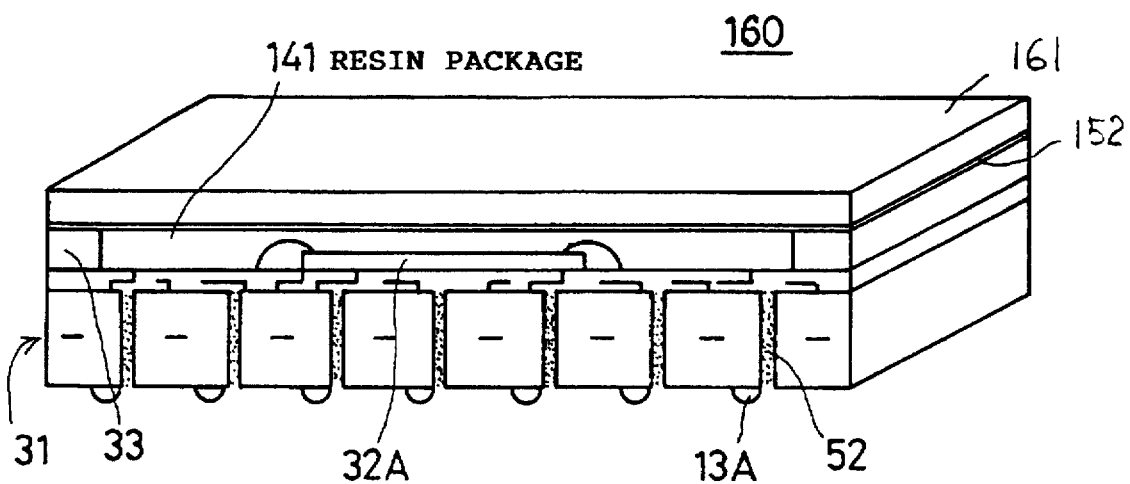
FIG. 16 is a partially sectional isometric view of a ninth embodiment of a BGA type semiconductor device according to the present invention.

FIG. 16 shows a ninth embodiment of a BGA type semiconductor device 160 according to the present invention.

The semiconductor device 160 has a structure such that a metal plate 161 is provided on the semiconductor device 140 of the seventh embodiment. The metal plate 161 is adhered to the upper surface of the resin package 141 by the paste layer 152 having a high heat transfer rate.

In the embodiments described above, stud bumps instead of the solder bumps 40 may be provided on the surface 32a of the semiconductor chip 32. Also, pins may be used, replacing the solder balls 13A.

Furthermore, instead of the paste layer 43, a film having a high heat transfer rate may be used. Or the paste layer 43 may include Ag as a filler.

The additive layer 151 may have a two-layer structure.

Instead of the insulating paste having a high heat transfer rate used for the paste layer 44, an anisotropic conductive resin may be used. Also, the insulating paste may be used for forming the dam, replacing the dam member 33.

Figure 17:
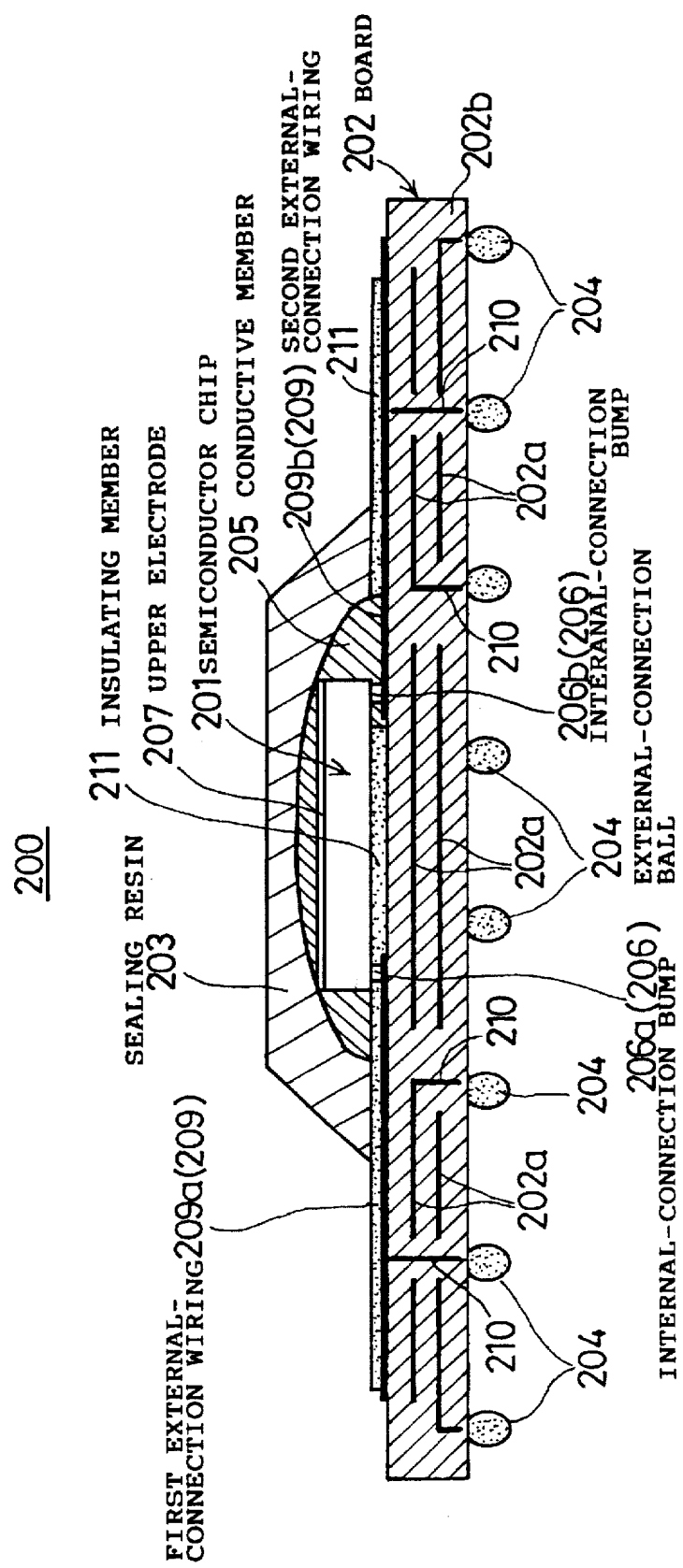
FIG. 17 is a cross-sectional view of a tenth embodiment of a semiconductor device according to the present invention.

FIG. 17 shows a cross-sectional view of a tenth embodiment of a semiconductor device 200 according to the present invention. In brief, the semiconductor device 200 includes a semiconductor chip 201, a board 202, a sealing resin 203, external-connection balls 204, and a conductive member 205.

The semiconductor chip 201 is provided with internal-connection bumps 206 on a lower surface thereof, which are used as first electrodes to be connected to the board 202. The internal-connection bumps 206 are formed from solder, for example. The other (upper) surface of the semiconductor chip 201 is provided with an upper electrode 207 which are used as a second electrode. In this embodiment, the upper electrode 207 is used as a ground electrode.

The board 202 is a multi-layered printed board which includes wiring layers 202a inside an insulating layer 202b made of glass-epoxy and the like. External-connection wirings 209 having a predetermined pattern are formed on an upper surface of the board 202. The external-connection wirings 209 include first external-connection wirings 209a serving as signal lines and power lines, and second external-connection wirings 209b serving as ground lines.

The semiconductor chip 201 is mounted on the board 202 by means of a flip-chip method. When the semiconductor chip 201 is mounted on the board 202, inner ends of the first external-connection wirings 209a are connected to the internal-connection bumps 206 of the semiconductor chip 201. Also, inner ends of the second external-connection wirings 209b are connected to the upper electrode 207 of the semiconductor chip 201 via the conductive member 205.

The external-connection wirings 209 and the wiring layers 202a are lead to a back surface of the board 202 through vias 210 formed across layers inside the board 202. At the back surface of the board 202, the vias 210 are connected to the external-connection balls 204, which may be formed from solder, for example.

The external-connection balls 204 can be formed by arranging solder balls or arranging copper balls plated with solder. Or the external-connection balls 204 can be formed by applying heat-reflow treatment to solder paste which are arranged in predetermined locations by a screen-printing method.

The sealing resin 203 is formed to cover the conductive member 205 which is provided so as to cover the semiconductor chip 201. The sealing resin 203 serves to protect the semiconductor chip 201. Epoxy resin and the like may be used for the sealing resin 203.

The conductive member 205 is also a novel point of this embodiment, and is formed from silver paste, for example. The conductive member 205 is formed by potting the silver paste so as to cover the semiconductor chip 201.

The conductive member 205 is electrically connected to the upper electrode 207 formed on the upper surface of the semiconductor chip 201. Furthermore, the conductive member 205 is electrically connected to the second external-connection wirings 209b at the upper surface of the board 202. Thus, the semiconductor chip 201 and the second external-connection wirings 209b are electrically connected with each other via the conductive member 205.

Figure 18:
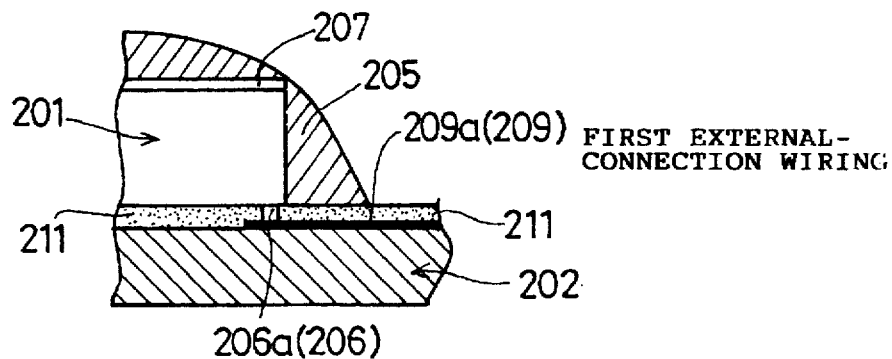
FIG. 18 is an enlarged partial view of the semiconductor device of FIG. 17.
Figure 19:
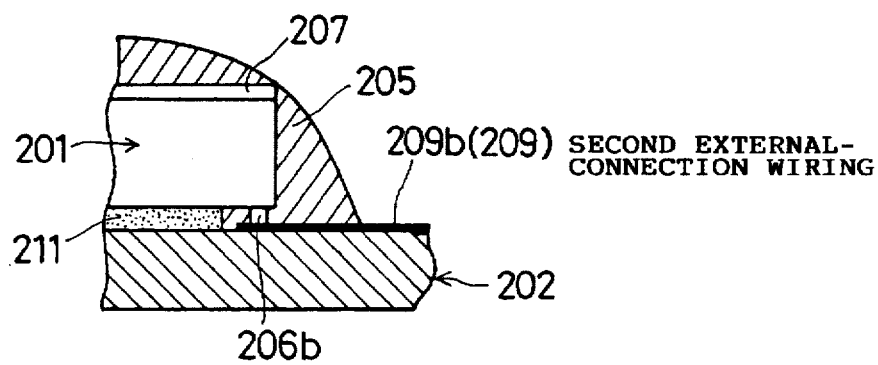
FIG. 19 is an enlarged partial view of the semiconductor device of FIG. 17.
Figure 20:
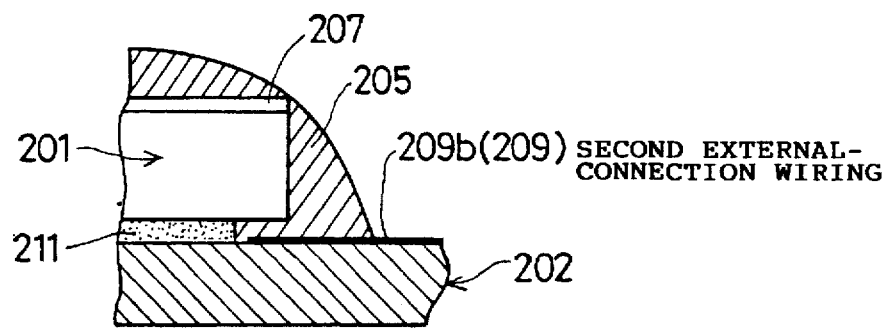
FIG. 20 is an enlarged partial view of the semiconductor device of FIG. 17.

FIG. 18 through FIG. 20 show structures of electrical connections between the semiconductor chip 201 and the external-connection wirings 209. In these figures, the sealing resin 203, the wiring layers 202a, and the external-connection balls 204 are omitted for the sake of clarity.

FIG. 18 shows a structure of an electrical connection between the internal-connection bump 206a formed on a signal pad of the semiconductor chip 201 and the first external-connection wirings 209a.

As shown in FIG. 18, an insulating member 211 is provided between the semiconductor chip 201 and the board 202. Also, the insulating member 211 is formed on the first external-connection wirings 209a at a connection point between the internal-connection bump 206a formed on the signal pad and the first external-connection wirings 209a.

Thus, the insulating member 211 electrically separates the first external-connection wirings 209a from the conductive member 205. As a result, the upper electrode (ground electrode) 207 connected to the conductive member 205 is never short-circuited to the first external-connection wirings 209a for conducting signals. Also, the insulating member 211 is formed from a resin which is a plastic, soft material. When heat is applied, stress is generated between the semiconductor chip 201 and the board 202 because of a difference in thermal-expansion coefficients of these two elements. However, the insulating member 211 can absorb the stress, thus enhancing the reliability of the semiconductor device 200.

FIG. 19 shows a structure of an electrical connection between the internal-connection bump 206b formed on a ground pad of the semiconductor chip 201 and the second external-connection wirings 209b.

As shown in FIG. 19, an insulating member 211 is not formed on the second external-connection wirings 209b at a connection point between the internal-connection bump 206b formed on the ground pad and the second external-connection wirings 209b. Thus, the second external-connection wirings 209b are exposed to the conductive member 205. As a result, the insulating member 205 is electrically connected with the second external-connection wirings 209b and the internal-connection bump 206b.

In summary, the insulating member 205 is electrically connected to the upper electrode 207 formed on the upper surface of the semiconductor chip 201, to the internal-connection bump 206b formed beneath the lower surface of the semiconductor chip 201, and to the second external-connection wirings 209b. Thus, the conductive member 205, the upper electrode 207, the internal-connection bump 206b, and the second external-connection wirings 209b are kept to the same ground level.

As shown in FIG. 17 and FIG. 19, the conductive member 205 has such a large volume that its inductance is lower than a wire connection. Thus, the electrical connection between the semiconductor chip 201 and the second external-connection wirings 209b can have a suitable characteristic.

As shown in FIG. 19, the ground electrode is provided as the upper electrode 207 on the upper surface of the semiconductor chip 201. However, the ground electrode can also be provided beneath the lower surface of the semiconductor chip 201 as is the internal-connection bump 206b.

Even when the ground electrodes are provided on both the upper and lower surfaces of the semiconductor chip 201, the same structure of the present invention as described above enables a connection between these ground electrodes and the second external-connection wirings 209b via the conductive member 205. Thus, such a connection can be readily implemented in this embodiment of the present invention.

FIG. 20 shows a structure of an electrical connection between the upper electrode 207 formed on the semiconductor chip 201 and the second external-connection wirings 209b at a location where no internal-connection bump 206 is provided.

As shown in FIG. 20, the conductive member 205 electrically connecting the upper electrode 207 and the second external-connection wirings 209b is not limited to a location where the internal-connection bump 206b is provided on the ground pad. That is, the conductive member 205 is also provided where no internal-connection bump 206 is formed. As in the above, the insulating member 211 is removed from the point of connection between the conductive member 205 and the second external-connection wirings 209b.

As described above, in the semiconductor device 200 of the tenth embodiment of the present invention, the upper electrode 207 formed on the semiconductor chip 201 can be connected to the second external-connection wirings 209b without relying on the internal-connection bump 206 for providing the connection. (The internal-connection bump 206 can be connected to the conductive member 205, but is not essential for establishing the electrical connection between the upper electrode 207 and the second external-connection wirings 209b.) Thus, the number of the internal-connection bumps 206 provided beneath the lower surface of the semiconductor chip 201 can be reduced. This leads to an extra space being provided for the arrangement of the internal-connection bumps 206.

Also, the second external-connection wirings 209b can be formed at any location on the board 202 as long as the conductive member 205 is provided at that location. This means that there is a wider scope for the arrangement of the second external-connection wirings 209b. For example, the second external-connection wirings 209b can be formed at locations where the first external-connection wirings 209a are not provided. Thus, the second external-connection wirings 209b can be arranged without a strenuous effort.

As described above, in the semiconductor device 200 of the tenth embodiment of the present invention, there is a wider scope for the arrangement of the internal-connection bumps 206 and the external-connection wirings 209. Thus, the manufacturing of the semiconductor device 200 can be easier, which leads to an improved yield.

Also, the conductive member 205 which is connected to the ground electrode and covers the semiconductor chip 201 can serve as a shielding member for the semiconductor chip 201. Thus, the shielding of the semiconductor chip 201 can be ensured, which leads to prevention of the malfunctions of the semiconductor chip 201.

The tenth embodiment has been described particularly with regard to a configuration in which the conductive member 205 serving as a ground wiring is connected with the upper electrode 207 serving as the ground electrode and with the internal-connection bump 206b. However, another configuration may be employed in which the conductive member 205 is connected to the power electrodes or the signal electrodes.

Figure 21:
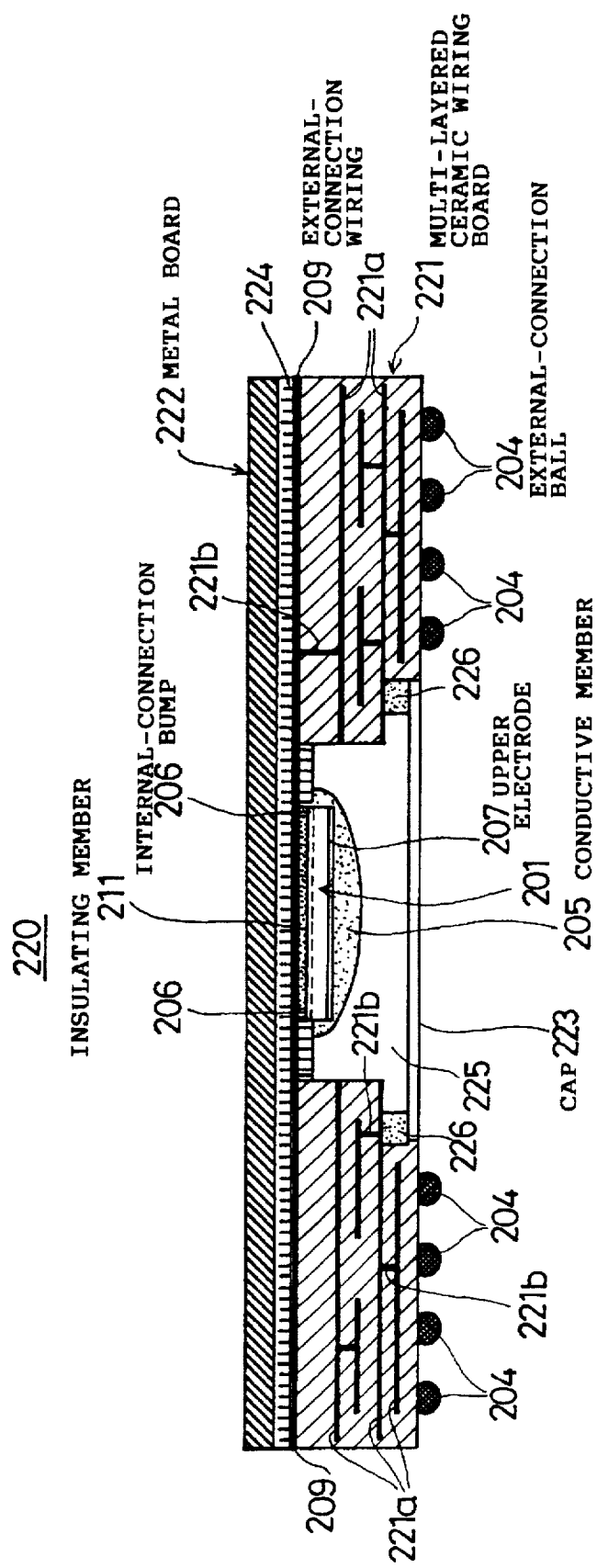
FIG. 21 is a cross-sectional view of an eleventh embodiment of a semiconductor device according to the present invention.

FIG. 21 shows a cross-sectional view of an eleventh embodiment of a semiconductor device 220 according to the present invention. In FIG. 21, the same element as those of FIG. 17 are referred by the same numerals.

In the eleventh embodiment, the board 202 is a multi-layered printed wiring board in which the wiring layers 202a and the vias 210 are formed inside the insulating layer 202b made of glass-epoxy. The eleventh embodiment is characterized in that a multi-layered ceramic wiring board 221 and a metal board 222 are used as boards.

In brief, the semiconductor device 220 includes the semiconductor chip 201, the multi-layered ceramic wiring board 221, the metal board 222, a cap 223, the external-connection balls 204, and the conductive member 205.

The multi-layered ceramic wiring board 221 includes wiring layers 221a and vias 221b connecting between the wiring layers 221a. Furthermore, the external-connection balls 204 are provided beneath the lower surface of the multi-layered ceramic wiring board 221, and are electrically connected to the relevant wiring layers 221a via the vias 221b.

A cavity 225 is formed at a general center of the multi-layered ceramic wiring board 221, and houses the semiconductor chip 201. An opening of the cavity 225 is provided with the cap 223 made of metal, which is fixed by means of a connection member 226. The cap 223 seals the cavity 225.

Beneath the lower surface of the metal board 222 is formed an insulating layer 224. The external-connection wirings 209 are provided beneath the lower surface of the insulating layer 224. The internal-connection bumps 206 are connected to the external-connection wirings 209 so that the semiconductor chip 201 is connected to the metal board 222 by means of a flip-chip method. The multi-layered ceramic wiring board 221 is fixed with an adhesive and the like on one side of the metal board 222 where the semiconductor chip 201 is provided.

The upper electrode 207 is formed on the surface of the semiconductor chip 201 opposite the surface on which the internal-connection bumps 206 are formed. In this embodiment, the upper electrode 207 is electrically connected to the external-connection wirings 209 via the conductive member 205 as in the previous embodiment.

In the semiconductor device 220 having what is called a ceramic-package structure using the multi-layered ceramic wiring board 221, the conductive member 205 can be used for electrically connecting the upper electrode 207 and the external-connection wirings 209. Accordingly, there is a wider scope for the arrangement of the internal-connection bumps 206 and the external-connection wirings 209. Thus, the manufacturing of the semiconductor device 220 can become easier, which leads to an improved yield at a time of implementation.

Figure 22:
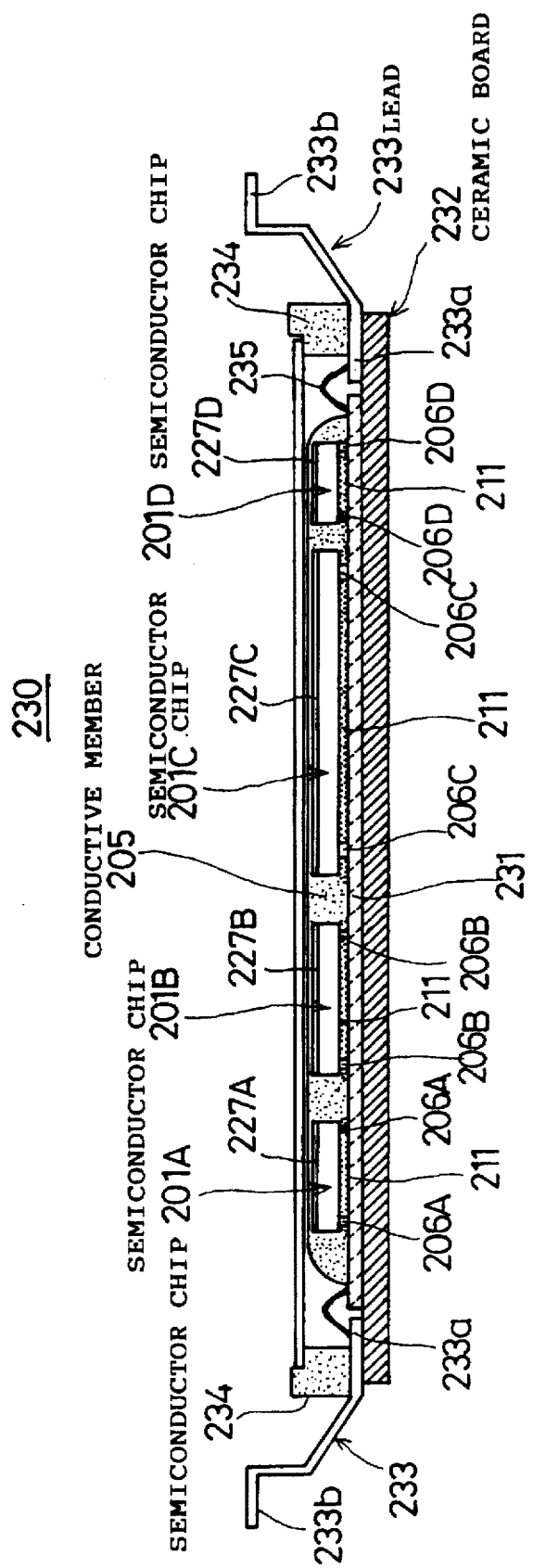
FIG. 22 is a cross-sectional view of a twelfth embodiment of a semiconductor device according to the present invention.

FIG. 22 shows a cross-sectional view of a twelfth embodiment of a semiconductor device 230 according to the present invention. In FIG. 22, the same element as those of FIG. 17 are referred by the same numerals.

In this embodiment, a plurality (four in the figure) of semiconductor chips 201A through 201D are packaged and provided on a wiring board 231. The twelfth embodiment is characterized in that the semiconductor device 230 is made into a multi-chip module (MCM).

In brief, the semiconductor device 230 includes the semiconductor chips 201A through 201D, the wiring board 231, a ceramic board 232, leads 233, a cap 236, and the conductive member 205.

The wiring board 231 is provided at an upper surface thereof with external-connection wirings (not shown), and the semiconductor chips 201A through 201D are connected to the wiring board 231 by means of a flip-chip method. The insulating member 211 is provided between each of the semiconductor chips 201A through 201D and the wiring board 231. Thus, as is described with reference to FIG. 18 through FIG. 20, some of the internal-connection bumps 206A through 206D are appropriately insulated from the conductive member 205.

The wiring board 231 is mounted on the ceramic board 232, whose perimeter is provided with a ceramic frame 234 having a frame shape. The leads 233 are fixed between the ceramic board 232 and the ceramic frame 234. An inner lead portion 233a of the leads 233 is electrically connected to the external-connection wirings formed on the wiring board 231 via wires 235. The cap 236 is provided at an upper opening of the ceramic frame 234, sealing the semiconductor chips 201A through 201D.

Upper electrodes 207A through 207D are, respectively, formed on the surfaces of the semiconductor chips 201A through 201D opposite the surfaces on which the internal-connection bumps 206A through 206D are formed. In this embodiment, the upper electrodes 207A through 207D are electrically connected to the external-connection wirings via the conductive member 205 as in the previous embodiments. Thus, the upper electrodes 207A through 207D formed on the semiconductor chip 201A through 201D, respectively, are kept to the same voltage level (e.g., the ground level).

As described above, in the semiconductor device 230 having the MCM package structure, the upper electrodes 207A through 207D can be connected to the external-connection wirings via the conductive member 205. Thus, the manufacturing of the semiconductor device 230 can be made easier, and the yield at a time of the implementation can be improved.

Figure 23:
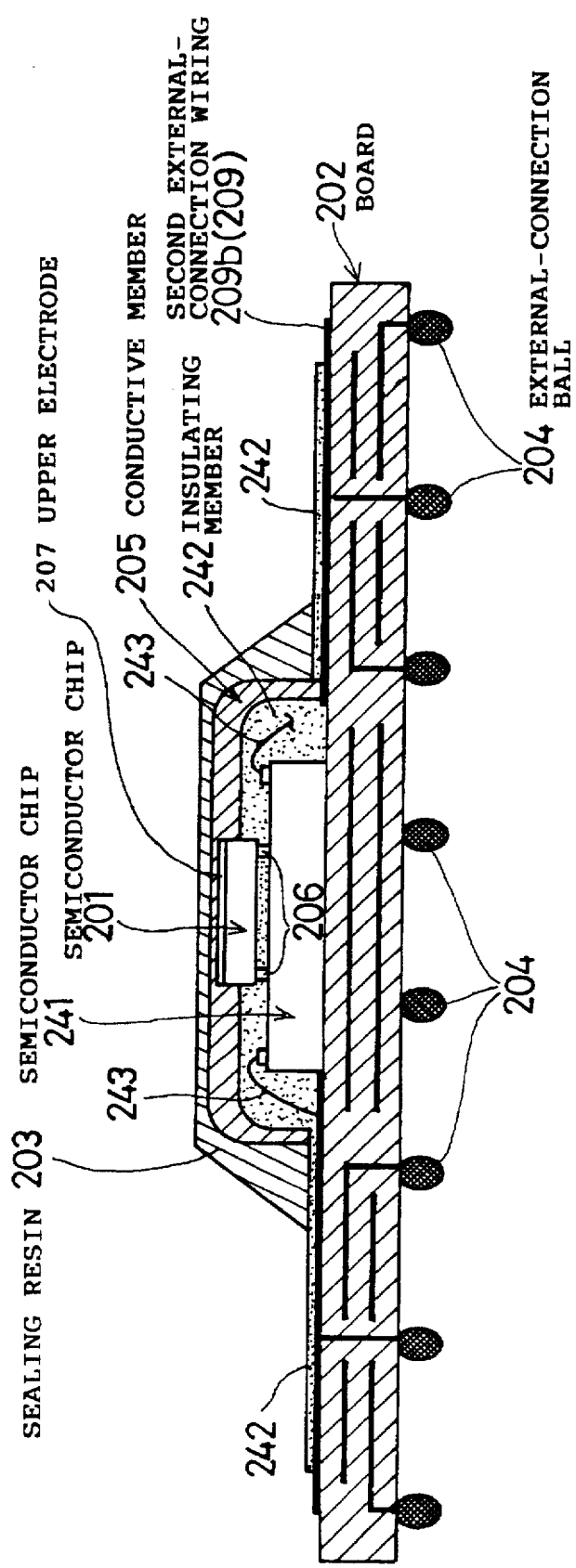
FIG. 23 is a cross-sectional view of a thirteenth embodiment of a semiconductor device according to the present invention.

FIG. 23 shows a cross-sectional view of a thirteenth embodiment of a semiconductor device 240 according to the present invention. In FIG. 23, the same elements as those of FIG. 17 are referred by the same numerals.

This embodiment is characterized in that the semiconductor device 240 has a chip-on-chip structure by piling two semiconductor chips 201 and 241 one over the other.

In brief, the semiconductor device 240 includes the semiconductor chips 201 and 241, the board 202, an insulating member 242, the sealing resin 203, the external-connection balls 204, and the conductive member 205.

The semiconductor chip 241 is electrically connected to the external-connection wirings 209 formed on the board 202 via wires 243. Electrodes (not shown) are provided on an upper surface of the semiconductor chip 241, and are electrically connected to the semiconductor chip 201. These electrodes are connected to the internal-connection bumps 206 formed on the semiconductor chip 201, so that the semiconductor chip 201 is connected to the upper surface of the semiconductor chip 241 by means of a flip-chip method. Thus, the semiconductor chip 201 ends up being mounted on the semiconductor chip 241.

The insulating layer 242 is provided to cover the semiconductor chip 241 and to cover part of the semiconductor chip 201. Thus, the points of electrical connection between the semiconductor chips 201 and 241 are insulated from the conductive member 205. Furthermore, the sealing resin 203 is provided to cover an upper surface of the conductive member 205.

The upper electrode 207 is provided on the surface of the semiconductor chip 201 opposite the surface on which the internal-connection bumps 206 are formed. The upper electrode 207 is electrically connected to the external-connection wirings 209b formed on the board 202 via the conductive member 205.

As described above, in the semiconductor device 240 having the chip-on-chip structure, the upper electrode 207 can be connected to the external-connection wirings 209b via the conductive member 205. Thus, the manufacturing of the semiconductor device 240 can be made easier, and the yield at a time of the implementation can be improved.

As described above, the semiconductor device according to the present invention can provide a wiring pattern on the additive layer without a restriction posed by the through-holes. Thus, for example, a wiring pattern traversing through-holes can be laid on the additive layer. In this manner, the path length of wiring patterns in the semiconductor devices having nodes beneath an assembly board can be reduced when compared with the case of the related art. As a result, compared to the related art, a better signal propagation characteristic can be obtained for signals having a high frequency.

Furthermore, the semiconductor device according to the present invention can lower an inside heat resistance, compared to semiconductor devices of the related art. Thus, the semiconductor device of the present invention can enhance a heat releasing characteristic, yet can properly seal the semiconductor chip inside.

Also, the semiconductor device according to the present invention can reduce the density of electrode arrangement, compared to a configuration in which all the electrodes are provided on the same surface of the semiconductor chip. Thus, the external-connection nodes can be arranged with a high density so as to be easily manufactured, leading to an improved yield.

Furthermore, the semiconductor device according to the present invention has the conductive member covering the semiconductor chip, so that the low inductance of the conductive member can provide better electrical characteristics. Also, when the conductive member is coupled to the ground level, the conductive member can serve as a shield for the semiconductor chip.

Furthermore, the semiconductor device according to the present invention can electrically connect the external-connection wirings with appropriate electrodes of the semiconductor chip via the conductive member. Thus, there is a wider scope for the arrangement of the external-connection wirings.

Also, the semiconductor chip according to the present invention provides the insulating member which can properly insulate the internal-connection bumps from each other or from the conductive member.

Furthermore, the present invention can be applied to the multi-chip module structure.

Furthermore, the present invention can be applied to the chip-on-chip structure.

Further, the present invention is not limited to these embodiments, but various variations and modifications may be made without departing from the scope of the present invention.

What is claimed is:

1. A semiconductor device comprising:

a board base having through-holes including an inner layer and filled with a filling core of a resin, said board base being a printed board;

an additive layer provided on an upper surface of said board base as well as an upper surface of said filling core providing support for said additive layer, said additive layer including a wiring pattern having one or more paths electrically connected with said inner layer, said support allowing said one or more paths to be laid out without a passage restriction posed by said through-holes;

a semiconductor chip fixed on an upper surface of said additive layer and having solder balls electrically connected with said one or more paths; and nodes provided on a lower surface of said board base, said nodes being electrically connected with said solder balls via said inner layer and said one or more paths.

2. The semiconductor device as claimed in claim 1, wherein said one or more paths include at least one path which traverses at least one upper surface of said through-holes.

3. The semiconductor device as claimed in claim 1, wherein said semiconductor chip is fixed with its face down on said upper surface of said additive layer by a bonding process.

4. The semiconductor device as claimed in claim 3, further comprising:

a dam member having a frame shape and adhered to said upper surface of said additive layer so as to surround said semiconductor chip; and a metal plate adhered to a back surface of said semiconductor chip and to said dam member.

5. An assembly board comprising:

a board base having through-holes including an inner layer and filled with a filling core of a resin, said board base being a printed board; and an additive layer provided on an upper surface of said board base as well as an upper surface of said filling core providing support for said additive layer, said additive layer including a wiring pattern having one or more paths electrically connected with said inner layer, said support allowing said one or more paths to be laid out without a passage restriction posed by said through holes.

6. The assembly board claimed in claim 5, wherein said one or more paths include at least one path which traverses at least one upper surface of said through-holes.

* * * * *